US006350673B1

(12) United States Patent
Larkin et al.

(10) Patent No.: US 6,350,673 B1
(45) Date of Patent: Feb. 26, 2002

(54) METHOD FOR DECREASING CHC DEGRADATION

(75) Inventors: David L. Larkin, Richardson; George E. Harris; William D. Smith, both of Garland, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/373,215

(22) Filed: Aug. 12, 1999

Related U.S. Application Data
(60) Provisional application No. 60/096,542, filed on Aug. 13, 1998.

(51) Int. Cl.⁷ .......................................... H01L 21/4763
(52) U.S. Cl. .................. 438/622; 438/624; 438/631; 438/958
(58) Field of Search ................ 438/624, 958, 438/622, 631

(56) References Cited

U.S. PATENT DOCUMENTS

| 5,100,817 A | * | 3/1992 | Cederbaum et al. .......... 437/41 |
| 5,607,773 A | * | 3/1997 | Ahlburn et al. ............. 428/427 |
| 5,693,961 A | * | 12/1997 | Hamada ...................... 257/66 |

* cited by examiner

*Primary Examiner*—Matthew Smith
*Assistant Examiner*—Craig P. Lytle
(74) *Attorney, Agent, or Firm*—W. James Brady, III

(57) ABSTRACT

A method for decreasing CHC degradation is provided. The method includes providing a semiconductor device (10) having at least one metal layer (28) completed. Then, a planarizing dielectric layer (30) is added to the semiconductor device (10). The semiconductor device (10) is heated in a hydrogen rich environment until hydrogen completely saturates the semiconductor device (10).

9 Claims, 1 Drawing Sheet

METHOD FOR DECREASING CHC DEGRADATION

This application claims priority under 35 USC §119(e)(1) of provisional application No. 60/096,542 filed Aug. 13, 1998.

TECHNICAL FIELD OF THE INVENTION

This invention relates to the field of semiconductor manufacturing and more specifically to a method for decreasing CHC degradation.

BACKGROUND OF THE INVENTION

The operation of semiconductor devices, such as a transistor, requires for its operation the flow of carriers from a source to a drain. Any breakdown in that flow can degrade device performance. Device performance has been known to be degraded by a phenomenon commonly known as CHC (channel hot carrier) degradation.

In multilevel semiconductor devices, i.e., those that have multiple metal layers, CHC degradation can occur from a variety of causes. In a multilevel semiconductor device, a first metal layer is formed and covered by a dielectric. The dielectric then has photoresist placed on it and the entire device undergoes photolithography. The dielectric is then etched in areas where the photoresist was removed. During processing or handling, contaminates (such as water, sodium, ions, and metallics) can be introduced to the semiconductor device. During the lifetime of the semiconductor device, contaminants can migrate down through the semiconductor devices and degrade the operation of the semiconductor device.

One solution to this problem is to use a dense material for the dielectric. One proposed material is to use a silane based oxide. It is theorized that the dense nature of silane based oxide keeps contaminants from migrating through the semiconductor device, thus decreasing the chance of performance degradation.

Unfortunately, silane based oxides have several drawbacks. First, in order to form silane based oxides, silane gas must be used. Silane gas is very reactive and special facilities are required to handle it. Also, silane based oxides have a tendency to undergo "bread loafing," or uneven application, which can result in voids in the dielectric.

Another way of reducing CHC degradation that has been proposed involves making the transition between the junction region under a gate and the junction region of the drain more gradual. This involves implanting the drain region multiple times using different dopants. This implantation is done with a mask in order to accurately dope the drain region. One drawback with this approach is that the process is very costly. Another drawback is that the procedure tends to decrease the distance between the source region and the drain region. To compensate for this, larger transistors are needed which leads to inefficient designs and higher manufacturing costs.

It has been theorized that contaminants migrate through the semiconductor device and encounter "dangling bonds". Some dangling bonds are the result of incomplete bonding at the silicon/dielectric interface, the poly gate/dielectric interface, the poly gate/gate oxide interface, and/or the gate oxide/silicon interface. It is also theorized that if the bonds can be pacified, contaminants are less likely to combine with the dangling bonds and degrade the device.

Another theory concerning CHC degradation is that contaminants are small enough to diffuse through the semiconductor device and accumulate, leading to degradation of performance. It is theorized that heat can cause an added element to bond to the contaminant, thus rendering the contaminant too large to diffuse through the semiconductor device.

Whatever the exact mechanism of damage, what is needed is a method for preventing contaminants from causing CHC degradation.

SUMMARY OF THE INVENTION

Accordingly, it may be appreciated that a need has arisen for a method for decreasing CHC degradation in accordance with the teaching of present invention.

In one embodiment a method for decreasing CHC degradation is disclosed. The method includes providing a semiconductor device having at least one metal layer completed. Then a planarizing dielectric layer is added to the semiconductor device. The semiconductor device then undergoes a hydrogen treatment until hydrogen completely saturates the semiconductor device.

The present invention provides various technical advantages over current methods for decreasing CHC degradation. For example, one technical advantage is that the chemicals used are easy to handle. Another technical advantage is that CHC degradation is reduced in an efficient manner. Other technical advantages may be readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, in which like reference numbers represent like parts, wherein.

DETAILED DESCRIPTION OF THE INVENTION

Figure 1:
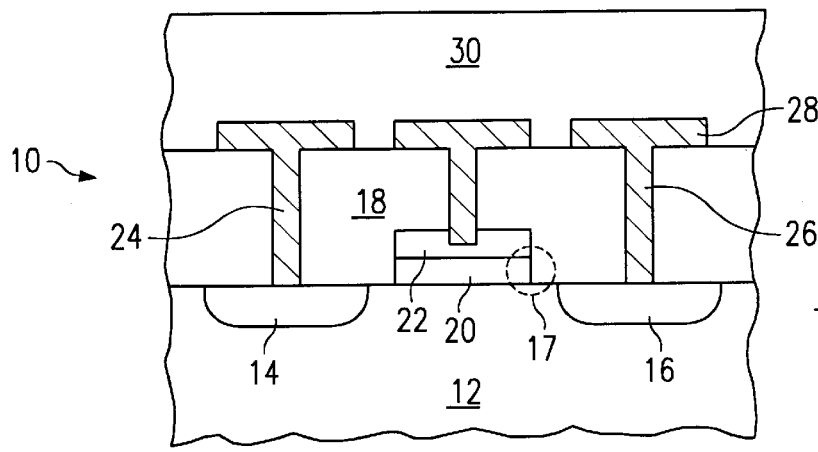
FIG. 1 illustrates a semiconductor device for decreasing CHC degradation.

FIG. 1 illustrates a semiconductor device 10. Illustrated is a substrate layer 12 having junction regions 14 and 16. Also illustrated is a gate oxide layer 20 which is located underneath a gate layer 22. A source contact 24 and a drain contact 26 are illustrated. A first dielectric layer 18 is formed above substrate 12. This is the first layer in a multilayer semiconductor device. Also illustrated is a metal layer 28. To further process semiconductor device 10 a planarizing dielectric layer (PDL) 30 is applied over metal layer 28. After metal layer 28 is in place, contaminants can be introduced either during processing (such as when a planarizing dielectric layer 30 is applied) or during handling.

Damage to device 10 can occur in areas highlighted by circle 17. This includes a gate oxide layer 20/gate layer 22 interface, a substrate layer 12/first dielectric layer 18 interface, a gate layer 22/first dielectric layer 18 interface, and a gate oxide layer 20/substrate layer 12 interface.

In the present invention, after planarizing dielectric layer 30 has been added, the entire semiconductor device 10 undergoes a hydrogen treatment. In one embodiment, a hydrogen treatment involves placing semiconductor device 10 in a hydrogen rich environment and heating semiconductor device 10 in that environment until hydrogen has saturated completely within semiconductor device 10. Other hydrogen treatments include any process that will introduce hydrogen throughout semiconductor device 10, including introducing hydrogen in situ using a plasma process. Alternatively, the hydrogen can be implanted directly using ion implantation. As previously discussed, this will either pacify any dangling bonds in semiconductor device 10 and, thus, prevent damage to gate oxide layer 20, or cause the hydrogen to bond with contaminants, thereby making the contaminant too large to diffuse through semiconductor device 10.

Figure 2:
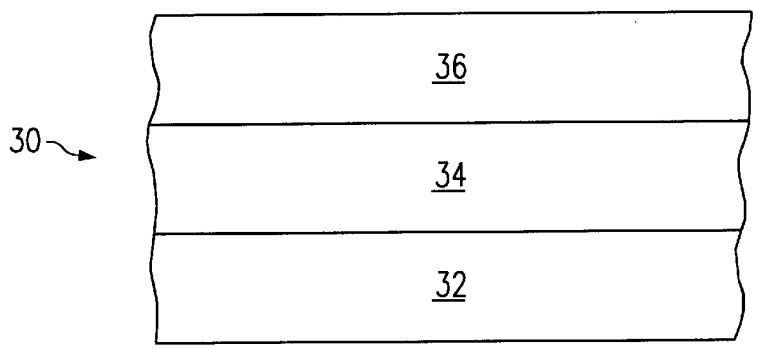
FIG. 2 illustrates one embodiment of the planarizing dielectric layer in the semiconductor device; and, FIG. 3 illustrates a flow chart of the manufacturing steps for creating the semiconductor device.

FIG. 2 illustrates one embodiment of planarizing dielectric layer 30. In this embodiment, planarizing dielectric layer 30 comprises three (3) distinct layers. A first layer 32 includes tetraethyloxysilicate (TEOS). First layer 32 is applied to semiconductor device 10 at a temperature of approximately 350 degrees centigrade using plasma enhanced chemical vapor deposition (PECVD). A second layer 34 includes hydrogen silsequioxane (HSQ). HSQ is applied as a liquid coating on top of first layer 32. Semiconductor device 10 is then taken to a furnace and cured until second layer 34 hardens. After second layer 34 hardens, semiconductor device 10 undergoes an $N_2$ pre-bake. The $N_2$ pre-bake is done to remove moisture from the HSQ of second layer 34 which is hydroscopic (readily absorbs moisture). A third layer 36 includes additional TEOS. Third layer 36 is also applied by PECVD. Upon formation of third layer 36, semiconductor device 10 undergoes the $H_2$ bake as described above. Although these chemicals have been listed as comprising planarizing dielectric layer 30, this is not to exclude any other suitable chemicals to be used for the different layers. It is true, however, that the use of a hydrogen treatment allows TEOS to be used instead of a silane based oxide in first layer 32.

Figure 3:
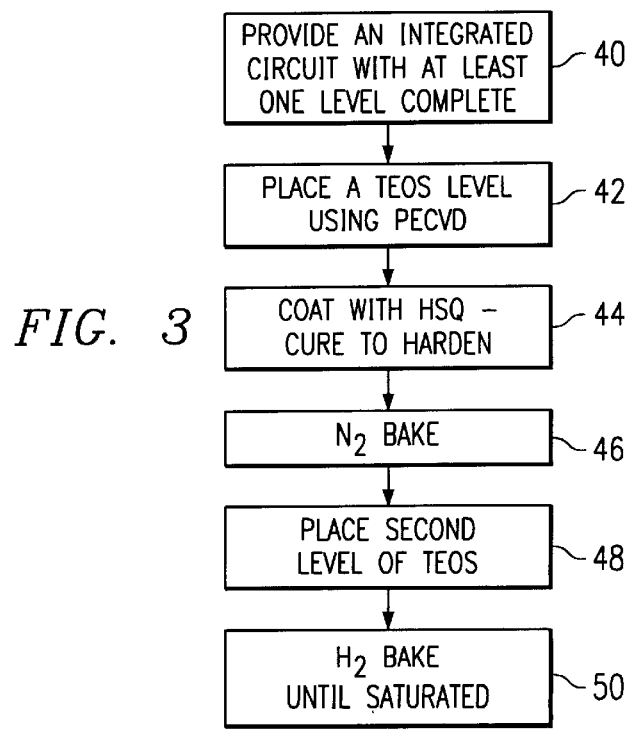

FIG. 3 illustrates a flow chart of the method of manufacturing semiconductor device 10. In a first step 40, an integrated circuit with at least one complete metal layer is provided. In step 42, a TEOS layer is applied using PECVD. Then in step 44, the TEOS layer is coated with HSQ. The integrated circuit is then cured until it is hardened. Then in step 46, an $N_2$ bake is done to remove any moisture collected during the HSQ coating. In step 48, a second layer of TEOS is applied using PECVD. In step 50, an $H_2$ bake is done until $H_2$ completely saturates and protects semiconductor device 10.

Thus, it is apparent that there has been provided, in accordance with the present invention, a method for decreasing CHC degradation that satisfies the advantages set forth above. Although the present invention has been described in detail, it should be understood that various changes, substitutions, and alterations may be readily ascertainable by those skilled in the art and may be made herein without departing from the spirit and scope of the present invention as defined by the following claims.

What is claimed is:

1. A method for decreasing CHC degradation, comprising:

providing a semiconductor device having at least one metal layer completed;

applying a planarizing dielectric layer directly on top of the at least one metal layer completed in the semiconductor device; and as a next processing step following the applying step, providing a hydrogen treatment until hydrogen diffuses throughout the semiconductor device.

2. The method of claim 1, wherein the hydrogen treatment includes heating the semiconductor device in a hydrogen rich environment.

3. The method of claim 1, wherein the hydrogen treatment includes applying hydrogen in situ by introducing hydrogen as a plasma to the semiconductor device.

4. The method of claim 1, wherein the planarizing dielectric layer includes a first layer of TEOS, a second layer of HSQ, and a third layer of TEOS.

5. The method of claim 1, wherein the planarizing dielectric layer includes a first layer of TEOS applied by PECVD.

6. The method of claim 1, wherein the planarizing dielectric layer includes a second layer of HSQ applied by coating over a first layer of dielectric material.

7. The method of claim 1, wherein the planarizing dielectric layer includes a third layer of TEOS applied by PECVD over two layers of dielectric material.

8. The method of claim 1, wherein the semiconductor device undergoes an $N_2$ bake after an HSQ layer of a multilayer planarizing dielectric layer is added.

9. The method of claim 1, wherein the semiconductor device undergoes the hydrogen treatment after a final layer of a multilayer planarizing dielectric layer is added.

* * * * *